United States Patent
Kazem et al.

(10) Patent No.: US 10,790,188 B2
(45) Date of Patent: Sep. 29, 2020

(54) SEAMLESS RUTHENIUM GAP FILL

(71) Applicant: Applied Materials, Inc., Santa Clara, CA (US)

(72) Inventors: Nasrin Kazem, Sunnyvale, CA (US); Jeffrey W. Anthis, San Jose, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 16/159,115

(22) Filed: Oct. 12, 2018

(65) Prior Publication Data
US 2019/0115255 A1 Apr. 18, 2019

Related U.S. Application Data

(60) Provisional application No. 62/572,448, filed on Oct. 14, 2017.

(51) Int. Cl.
| | | |
|---|---|---|
| C23C 16/06 | (2006.01) | |
| H01L 21/768 | (2006.01) | |
| C23C 16/04 | (2006.01) | |
| C23C 16/56 | (2006.01) | |
| H01L 21/285 | (2006.01) | |

(52) U.S. Cl.
CPC ...... *H01L 21/76877* (2013.01); *C23C 16/045* (2013.01); *C23C 16/06* (2013.01); *C23C 16/56* (2013.01); *H01L 21/28562* (2013.01); *H01L 21/76843* (2013.01); *H01L 21/76867* (2013.01); *H01L 21/76882* (2013.01)

(58) Field of Classification Search
CPC ....... C23C 16/06; C23C 16/40; C23C 16/405; C23C 16/56
See application file for complete search history.

(56) References Cited

U.S. PATENT DOCUMENTS

| 9,711,449 B2 | 7/2017 | Yu et al. | |
|---|---|---|---|
| 2004/0105934 A1* | 6/2004 | Chang | B82Y 30/00 427/255.28 |
| 2006/0244082 A1* | 11/2006 | Ahn | C23C 16/18 257/410 |
| 2007/0077750 A1* | 4/2007 | Ma | H01L 21/76873 438/618 |
| 2009/0075450 A1* | 3/2009 | Lee | H01L 28/65 438/396 |

(Continued)

FOREIGN PATENT DOCUMENTS

KR 100799127 B1 1/2008

OTHER PUBLICATIONS

Pagliaro, Mario, et al., Review "Ru-based oxidation catalysis". Chem. Soc. Rev., 2005, 34, 837-845.*

(Continued)

*Primary Examiner* — Bret P Chen
(74) *Attorney, Agent, or Firm* — Servilla Whitney LLC

(57) ABSTRACT

Methods for filling a substrate feature with a seamless ruthenium gap fill are described. The methods include depositing a ruthenium film, oxidizing the ruthenium film to form an oxidized ruthenium film, reducing the oxidized ruthenium film to a reduced ruthenium film and repeating the oxidation and reduction processes to form a seamless ruthenium gap fill.

17 Claims, 1 Drawing Sheet

(56) References Cited

U.S. PATENT DOCUMENTS

| | | | |
|---|---|---|---|
| 2009/0104777 A1* | 4/2009 | Kim | C23C 16/40 438/686 |
| 2009/0163024 A1* | 6/2009 | Kim | C23C 16/16 438/653 |
| 2009/0230471 A1* | 9/2009 | Li | H01L 21/32137 257/347 |
| 2010/0227476 A1* | 9/2010 | Peck | C23C 16/40 438/680 |
| 2011/0027977 A1* | 2/2011 | Li | C23C 16/0281 438/584 |
| 2015/0050431 A1* | 2/2015 | Park | C23C 16/45553 427/576 |

OTHER PUBLICATIONS

Austin, Dustin Z., et al., "Atomic Layer Deposition of Ruthenium and Ruthenium Oxide Using a Zero-Oxidation State Precursor". Chem. Mater. 2017, 29, 1107-1115.*

Herd, Benjamin, et al., "Room Temperature Oxidation of Ruthenium". J. Phys. Chem. C 2013, 117, 15148-15154.*

Sharma, Satya P., et al., "Oxidation of Ruthenium". IEEE Transacttons on Components, Hybrids, and Manufactutung Technology, vol. CHMT-6, No. 1, Mar. 1983, pp. 89-92.*

* cited by examiner

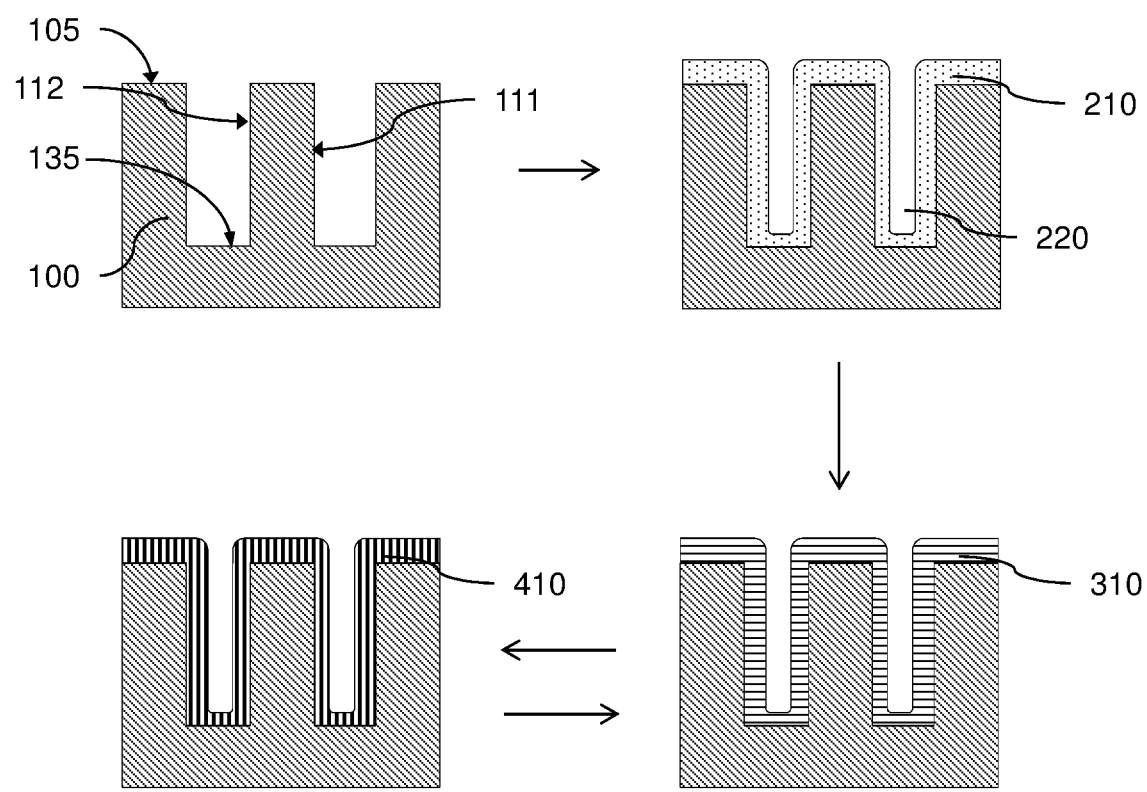

SEAMLESS RUTHENIUM GAP FILL

CROSS-REFERENCE TO RELATED APPLICATIONS

This application claims priority to U.S. Provisional Application No. 62/572,448, filed Oct. 14, 2017, the entire disclosure of which is hereby incorporated by reference herein.

FIELD

Embodiments of the disclosure generally relate to methods for filling substrate features with a seamless ruthenium fill. More particularly, embodiments of the disclosure are directed to methods for filling a substrate feature with a seamless ruthenium fill through a deposition-oxidation-reduction process.

BACKGROUND

The process of filling substrate features (gap fill) is a very important stage of semiconductor manufacturing. The gap fill process can be used to fill a high aspect ratio gap (or feature) with an insulating or conducting material. For example, shallow trench isolation, inter-metal dielectric layers, passivation layers, dummy gate, etc. As device geometries shrink (e.g., critical dimensions <20 nm) and thermal budgets are reduced, defect-free filling of spaces becomes increasingly difficult due to limitations of conventional deposition processes. Additionally, the seam in the gap fill is a limitation in traditional gap fill deposition processes.

Flowable films provide a particular solution to resolve the issue of void or seam containing gap fill at contact levels, causing reliability concerns. Among the metals of choice, ruthenium remains one of the best candidates for filling the contacts at advanced nodes <7 nm. However, there are still obstructing challenges for providing void and seam free ruthenium gap fill. The traditional approach to forming a flowable film would have been making ruthenium films flowable by heating them up, similar to the methods used for cobalt flowability. But, ruthenium has very high melting point of 2,334° C. that makes it very difficult to become flowable.

Therefore, there is a need for a method to create a seamless ruthenium gap fill.

SUMMARY

One or more embodiments of the disclosure are directed to a method of substrate processing comprising providing a substrate having a surface and at least one feature with a sidewall and a bottom in said surface. A ruthenium film is formed with a thickness on the surface and within the at least one feature. The ruthenium film is repeatedly oxidized to form an oxidized ruthenium film and the oxidized ruthenium film reduced to a reduced ruthenium film for a number of cycles. The reduced ruthenium film forms a substantially seamless ruthenium gap fill within the at least one feature at the end of the number of cycles.

Another embodiment of the disclosure is directed to a method of substrate processing comprising providing a substrate having a surface and at least one feature in said surface with a sidewall and a bottom. A continuous ruthenium film is formed with a thickness greater than or equal to about 10 Å on the surface and within the at least one feature. The ruthenium film within the at least one feature forms an open seam. The substrate is exposed to an oxidant comprising oxygen to form a ruthenium oxide layer on the ruthenium film. The substrate is exposed to a reductant comprising hydrogen to form a reduced ruthenium layer from the ruthenium oxide layer. The exposure of the substrate to the oxidant and reductant is repeated for a number of cycles to form a substantially seamless ruthenium gap fill within the at least one feature. The number of cycles is greater than or equal to about 100.

Other embodiments of the disclosure are directed to a method of substrate processing comprising providing a substrate having a surface and at least one feature in said surface with a sidewall and a bottom. A continuous ruthenium film is formed with a thickness in the range of about 15 Å to about 20 Å on the surface and within the at least one feature. The ruthenium film within the at least one feature forms an open seam. The substrate is repeatedly exposed to an oxidant comprising nitrogen plasma to form a ruthenium nitride layer on the ruthenium film and the ruthenium nitride layer decomposed to a reduced ruthenium film for a number of cycles. The reduced ruthenium film forms a substantially seamless ruthenium gap fill within the at least one feature at the end of greater than or equal to about 200 cycles.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE shows a cross-sectional schematic of a gap fill process in accordance with one or more embodiments of the disclosure.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

One or more embodiments of the disclosure advantageously provide ruthenium gap fill by converting ruthenium to a ruthenium containing material (RuA) with lower melting point which can be reversibly converted to metallic ruthenium phase by using a co-reactant B. Without being bound by any particular theory of operation, it is believed that converting ruthenium to RuA causes atomic arrangement of ruthenium atoms which will be reformed upon reduction, introducing atomic scale movements. By converting RuA back to ruthenium, a new atomic arrangement will be forced which is not necessarily the same as the initial atomic distribution due to the random nature of this rearrangement.

Some embodiments of this disclosure introduce $O_2$ and $H_2$ as examples of A and B reactants facilitating ruthenium movements in the nanostructured features at temperatures of approximately 400° C. By oxidizing ruthenium to $RuO_2$, the volume of the ruthenium film increases, forcing ruthenium atoms to move away from each other in all directions, inserting oxygen atoms in between. During the reduction cycle by $H_2$, ruthenium atoms are required to densify and form metallic bonding directly to neighbor ruthenium atoms. This process is not a reversible process back to the original ruthenium film atomic configuration due to two main factors: First, $Ru_2O$ has melting point of 1300° C. and should become flowable at 400° C. Second, oxidation and reduction cycles result in random movement of ruthenium atoms.

It is believed that the higher number of $O_2/H_2$ cycles enhances the ruthenium movements suggesting that the atomic rearrangement should have the highest contribution in moving ruthenium in the features compared to the flowability. Other practitioners in the field doubted that such a rearrangement, as a result of oxidation/reduction cycles, would result in a flowable film and production of a seamless gap fill. The inventors pursued this oxidation/reduction process to arrive at the present surprising results.

The FIGURE shows a cross-sectional view of a substrate 100 with two features 110 (e.g. trenches). The FIGURE shows a substrate having two features for illustrative purposes; however, those skilled in the art will understand that there can be fewer or more features. The shape of the feature 110 can be any suitable shape including, but not limited to, trenches and vias. In specific embodiments, the feature 110 is a trench. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features can have any suitable aspect ratio (ratio of the depth of the feature to the width of the feature).

In some embodiments, the aspect ratio of the at least one feature is greater than or equal to about 5:1, 10:1, 15:1, 20:1, 25:1, 30:1, 35:1 or 40:1.

The substrate 100 has a surface 105 and at least one feature 110. The feature 110 extends from the surface 105 outside the feature to a depth D to the bottom 135. The feature 110 has a first sidewall 111 and a second sidewall 112 that define a width W of the feature 110. The open area formed by the sidewalls 111, 112 and bottom 135 are also referred to as a gap. Materials which fill the gap are referred to as gap fill.

One or more embodiments of the disclosure are directed to methods of substrate processing which provide seam free ruthenium gap fill in substrate features.

With reference to the FIGURE, a ruthenium film 210 is formed on the substrate. The ruthenium film 210 can be formed by any suitable process including, but not limited to, chemical vapor deposition, physical vapor deposition, plasma-enhanced chemical vapor deposition, atomic layer deposition, plasma-enhanced atomic layer deposition and/or physical vapor deposition. In some embodiments, the ruthenium film 210 is formed by chemical vapor deposition. Regardless of the process utilized, the ruthenium film 210 is formed on the surface 105 of the substrate 100 as well as within the feature 110.

Within the feature 110, the film 210 is formed along the sidewalls 111, 112 and the bottom 135. The film formed contains a gap 220. In some embodiments, the gap is a byproduct of film deposition ceasing before the feature 110 is full. For example, higher aspect ratio features are more likely to form a closed seam during deposition as the film at the top of the feature 110 tends to pinch closed so that a seam is enclosed within the deposited film. The gap is any space or void that remains between the sidewalls 111, 112 of the feature 110 after depositing the film 210.

The thickness of the film 210 can vary depending on, for example, the substrate surface and the formation processes selected. In some embodiments, the film 210 has a thickness greater than or equal to about 10 Å. In one or more embodiments, the film 210 has a thickness in the range of about 1 Å to about 100 Å, or in the range of about 10 Å to about 50 Å, or in the range of about 15 Å to about 20 Å. In some embodiments, the thickness of the film 210 is greater than 0 Å and less than or equal to about 100 Å, 75 Å, 50 Å, 25 Å, 20 Å or 15 Å. In some embodiments, the film 210 has a minimum thickness sufficient to form a continuous layer. In this regard the film 210 may be described as continuous. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the film 210 forms conformally on the substrate 100, including the surface 105 and the feature 110. As used herein, the term "conformal", or "conformally", refers to a layer that adheres to and covers exposed surfaces with a thickness having a variation of less than 1% relative to the average thickness of the film. For example, a 100 Å thick film would have less than 1 Å variations in thickness. This thickness and variation includes edges, corners, sides, and the bottom of recesses. For example, a conformal layer deposited in various embodiments of the disclosure would provide coverage over the deposited region of essentially uniform thickness on complex surfaces including features.

In some embodiments, similar to the FIGURE, the ruthenium film 210 is deposited such that the gap 220 is not covered over by the film 210. These embodiments contain what is referred to as an open seam. In some embodiments, not shown, the ruthenium film is deposited such that the gap 220 is covered by the film 210. These embodiments contain what is referred to as a closed seam.

After forming the film 210, the processes described herein comprise an oxidation process followed by a reduction process. The oxidation and reduction processes are performed sequentially, and an equal number of times. Each time that the oxidation and reduction processes are performed is referred to as a cycle. In some embodiments, multiple cycles are completed to form the seamless ruthenium gap fill. In some embodiments, the number of cycles performed is greater than or equal to about 20 cycles, or greater than or equal to about 40 cycles, or greater than or equal to about 75 cycles, or greater than or equal to about 100 cycles, or greater than or equal to about 150 cycles, or greater than or equal to about 200 cycles, or greater than or equal to about 300 cycles, or greater than or equal to about 400 cycles, or greater than or equal to about 500 cycles. In some embodiments, the number of cycles is in the range of about 40 cycles to about 500 cycles, or in the range of about 50 cycles to about 400 cycles, or in the range of about 100 cycles to about 300 cycles, or in the range of about 150 cycles to about 250 cycles, or in the range of about 180 cycles to about 220 cycles. In some embodiments, the number of cycles is less than or equal to about 500 cycles, or less than or equal to about 400 cycles, or less than or equal to about 300 cycles, or less than or equal to about 250 cycles, or less than or equal to about 200 cycles, or less than or equal to about 150 cycles, or less than or equal to about 100 cycles, or less than or equal to about 75 cycles, or less than or equal to about 50 cycles, or less than or equal to about 40 cycles.

The ruthenium film 210 is oxidized to form an oxidized ruthenium film 310. The oxidized ruthenium film is any material comprising ruthenium with an average oxidation state greater than the average oxidation state of the ruthenium film 210. In this regard, an oxidized ruthenium film describes the relative oxidation state of the metal atoms within the film, without any bearing on the relative composition of the film. In this sense, the oxidized ruthenium film need not comprise any oxygen.

The ruthenium film 210 may be oxidized to form an oxidized ruthenium film 310 by any suitable process. In some embodiments, the ruthenium film 210 is oxidized by exposing the substrate to an oxidant. In some embodiments, the oxidant comprises one or more of oxygen, ozone, nitrogen or plasmas thereof. In some embodiments, the oxidant consists essentially of oxygen. In some embodiments, the oxidant consists essentially of a nitrogen plasma. In some embodiments, the oxidized ruthenium film is formed through a thermal oxidation process. In some embodiments, the oxidized ruthenium film is formed through a plasma oxidation process. In some embodiments, the oxidation process is a thermal oxidation process which utilizes an oxidant consisting essentially of oxygen. As used in this regard, "consists essentially of" means that the oxidant is greater than or equal to about 98%, 99% or 99.5% of the specified oxidant on a molar basis, excluding any carrier or diluent components.

In some embodiments, during oxidation of the ruthenium film 210 to form an oxidized ruthenium film 310, only a portion of the ruthenium film is oxidized. Without being bound by theory, the exposed portions of the ruthenium film are oxidized prior to portions which are closer to the substrate. In some embodiments, less than 100% of the thickness of the ruthenium film 210 is oxidized to form the oxidized ruthenium film 310. In some embodiments, less than 95%, 90%, 80%, 75%, 70%, 60%, 50%, 40%, 30%, 25%, 20%, 15%, 10% or 5% of the thickness of the ruthenium film is oxidized.

The oxidized ruthenium film 310 is oxidized to form a reduced ruthenium film 410. The reduced ruthenium film is any material comprising ruthenium with an average oxidation state less than the average oxidation state of the oxidized ruthenium film 310. In some embodiments, the reduced ruthenium film has an average oxidation state about equal to the ruthenium film 210. In some embodiments, the reduced ruthenium film consists essentially of ruthenium atoms. As used in this regard, "consists essentially of" means that the reduced ruthenium film 410 is greater than or equal to about 80, 85, 90, 95, 98, 99 or 99.5 atomic % of the specified element. In this regard, a reduced ruthenium film describes the relative oxidation state of the metal atoms within the film, without any bearing on the relative composition of the film.

The oxidized ruthenium film 310 may be reduced to form a reduced ruthenium film 410 by any suitable process. In some embodiments, the oxidized ruthenium film 310 is reduced by exposing the substrate to a reductant. In some embodiments, the reductant comprises one or more of hydrogen, formic acid, hydrazine, hydrazine derivatives, ammonia or plasmas thereof. In this regard, hydrazine derivatives are any material of the general formula $R_2NNR_2$, where each R is independently selected from hydrogen, halogens, or C1-C6 alkyl, or aryl. In some embodiments, the reductant consists essentially of hydrogen. In some embodiments, the reduction process is a thermal reduction process which utilizes a reductant consisting essentially of hydrogen. As used in this regard, "consists essentially of" means that the oxidant is greater than or equal to about 98%, 99% or 99.5% of the specified reductant on a molar basis, excluding any carrier or diluent components.

In some embodiments, the oxidized ruthenium film 310 is reduced without exposing the substrate to any reductant. Without being bound by theory, the inventors believe it is possible that several oxidized ruthenium films will thermally decompose without being exposed to a chemical reductant.

In some embodiments, the reduced ruthenium film is formed through a thermal reduction process. In some embodiments, the reduced ruthenium film is formed through a plasma reduction process.

After formation of the reduced ruthenium film 410, the cycle is complete and another cycle may begin. The process restarts with the oxidation of the reduced ruthenium film 410 to form an oxidized ruthenium film 310. In some embodiments, the state of the ruthenium film within the substrate is evaluated after a predetermined number of cycles. In some embodiments, the ruthenium film may not have formed a predetermined quantity of seamless gap fill and another cycle will begin. In some embodiments, the ruthenium film will have formed a predetermined quantity of seamless gap fill and the method may be ended.

A thermal oxidation/reduction process is an oxidation/reduction process which is promoted through the use of specific reactants and heat, without the use of plasma. A plasma oxidation/reduction process is an oxidation/reduction process promoted through the formation of radicals of specific reactants. The plasmas utilized in plasma oxidation/reduction processes can be direct plasmas or remote plasmas. The plasmas utilized in plasma oxidation/reduction processes can be conductively coupled plasmas (CCP) or inductively coupled plasmas (ICP). In some embodiments, the oxidation and/or reduction process is radical enhanced in which an oxidant or reductant is passed across a hot wire to generate radicals within the gas without ionizing the gas.

Examples of thermal oxidation reactants include, without limitation, $O_2$, $O_3$, $N_2O$, $H_2O$, $H_2O_2$, CO, $CO_2$ and combinations thereof. Examples of thermal reduction reactants include, without limitation, hydrogen, alcohols, carboxylic acids, aldehydes, silanes, boranes, ammonia, hydrazine, hydrazine derivatives and combinations thereof.

Examples of plasma oxidation reactants include, without limitation, plasmas of $O_2$, $O_3$, $H_2O$, $H_2O_2$ and combinations thereof. Examples of plasma reduction reactants include, without limitation plasmas of hydrogen, ammonia, hydrazine, hydrazine derivatives and combinations thereof.

While not pictured in the FIGURE, in some embodiments, the method of substrate processing may further comprise repeating the formation of the ruthenium film 210 at the end of one or more cycles. In these embodiments, the ruthenium film 210 is then oxidized and reduced as described herein.

The methods described herein may be conducted at any suitable temperature. In some embodiments, the formation of the ruthenium film is performed at a first substrate temperature and the oxidation and reduction are performed at a second temperature different from the first temperature. In some embodiments, the first temperature is lower than the second temperature. In some embodiments, the first temperature is in the range of about 200° C. to about 300° C. In some embodiments, the second temperature is in the range of about 350° C. to about 450° C.

In some embodiments, the substrate is maintained at a single temperature for both formation of the ruthenium film and oxidation/reduction processes. In some embodiments, the substrate is maintained at a temperature in the range of about 100° C. to about 500° C., about 200° C. to about 475° C., or about 300° C. to about 450° C. In some embodiments, the substrate is maintained at a temperature less than or equal to about 450° C., less than or equal to about 400° C., less than or equal to about 375° C., less than or equal to about 350° C., less than or equal to about 300° C., or less than or equal to about 250° C. In some embodiments, the substrate is maintained at a temperature greater than or equal to about 150° C., greater than or equal to about 200° C., greater than or equal to about 250° C., greater than or equal to about 300° C., greater than or equal to about 350° C., or greater than or equal to about 400° C.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of substrate processing comprising:
providing a substrate having a surface and at least one feature with a sidewall and a bottom in said surface;
forming a ruthenium film with a thickness on the surface and within the at least one feature; and
repeatedly oxidizing the ruthenium film to form an oxidized ruthenium film and reducing the oxidized ruthenium film to a reduced ruthenium film for a number of cycles, the reduced ruthenium film forming a substantially seamless ruthenium gap fill within the at least one feature at an end of the number of cycles,
wherein reducing the oxidized ruthenium film comprises thermal decomposition of the oxidized ruthenium film and reducing the oxidized ruthenium film does not include exposing the substrate to a reductant.

2. The method of claim 1, wherein the substrate is maintained at a temperature less than or equal to about 400° C.

3. The method of claim 1, wherein formation of the ruthenium film is performed by chemical vapor deposition.

4. The method of claim 1, wherein the ruthenium film formed on the substrate is continuous.

5. The method of claim 1, wherein the ruthenium film formed on the substrate has a thickness of greater than or equal to about 10 Å.

6. The method of claim 1, wherein the ruthenium film is formed within the at least one feature forms an open seam.

7. The method of claim 1, wherein oxidizing the ruthenium film comprises exposing the substrate to an oxidant comprising one or more of oxygen, ozone, nitrogen or plasmas thereof.

8. The method of claim 7, wherein oxidizing the ruthenium film is performed through a process comprising thermal oxidation.

9. The method of claim 7, wherein oxidizing the ruthenium film is performed through a process comprising plasma oxidation.

10. The method of claim 1, wherein oxidizing the ruthenium film oxidizes less than 50% of the thickness of the ruthenium film.

11. The method of claim 1, wherein reducing the ruthenium film comprises exposing the substrate to a reductant comprising one or more of hydrogen, formic acid, hydrazine, hydrazine derivatives, ammonia or plasmas thereof.

12. The method of claim 11, wherein reducing the oxidized ruthenium film is performed through a process comprising thermal reduction.

13. The method of claim 11, wherein reducing the oxidized ruthenium film is performed through a process comprising plasma reduction.

14. The method of claim 1, wherein the number of cycles is greater than or equal to about 40 cycles.

15. The method of claim 14, wherein the number of cycles is in the range to about 100 cycles to about 300 cycles.

16. The method of claim 1, further comprising repeating formation of the ruthenium film at the end of one or more cycles and repeatedly oxidizing and reducing the ruthenium film.

17. A method of substrate processing comprising:
providing a substrate having a surface and at least one feature in said surface with a sidewall and a bottom;
forming a continuous ruthenium film with a thickness in the range of about 15 Å to about 20 Å on the surface and within the at least one feature, the ruthenium film within the at least one feature forming an open seam; and repeatedly exposing the substrate to an oxidant comprising nitrogen plasma to form a ruthenium nitride layer on the ruthenium film and decomposing the ruthenium nitride layer to a reduced ruthenium film without exposing the substrate to a reductant for a number of cycles, the reduced ruthenium film forming a substantially seamless ruthenium gap fill within the at least one feature at an end of greater than or equal to about 200 cycles.

* * * * *